(12) United States Patent
Raghavan et al.

(10) Patent No.: US 8,445,353 B1
(45) Date of Patent: May 21, 2013

(54) METHOD FOR INTEGRATING MIM CAPACITOR AND THIN FILM RESISTOR IN MODULAR TWO LAYER METAL PROCESS AND CORRESPONDING DEVICE

(75) Inventors: Venkat Raghavan, Union City, CA (US); Sheldon Haynie, San Martin, CA (US); Andrew Strachan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 197 days.

(21) Appl. No.: 12/586,836

(22) Filed: Sep. 29, 2009

(51) Int. Cl.
*H01L 21/20* (2006.01)

(52) U.S. Cl.
USPC .................................. 438/381; 257/E27.025

(58) Field of Classification Search
USPC ................. 438/381, 384, 387, 396, 171, 190, 438/210; 257/303, 359
See application file for complete search history.

(56) References Cited

U.S. PATENT DOCUMENTS

| | | | |
|---|---|---|---|
| 5,554,558 A | 9/1996 | Hsu et al. | |
| 6,204,144 B1 | 3/2001 | Hsu | |
| 6,603,167 B2 | 8/2003 | Hsue et al. | |
| 7,078,310 B1 * | 7/2006 | Kar-Roy et al. | 438/396 |
| 7,510,944 B1 | 3/2009 | Raghavan et al. | |
| 7,633,373 B1 * | 12/2009 | Johnson et al. | 338/195 |
| 2005/0012223 A1 | 1/2005 | Koller et al. | |
| 2005/0272216 A1 * | 12/2005 | Remmel et al. | 438/381 |
| 2006/0163640 A1 | 7/2006 | Park et al. | |
| 2006/0181389 A1 * | 8/2006 | Cho | 338/309 |
| 2008/0048188 A1 * | 2/2008 | Pei | 257/66 |
| 2008/0233704 A1 * | 9/2008 | Fechner et al. | 438/381 |

* cited by examiner

*Primary Examiner* — Matthew Landau
*Assistant Examiner* — Khaja Ahmad
(74) *Attorney, Agent, or Firm* — Eugene C. Conser; Wade J. Brady, III; Frederick J. Telecky, Jr.

(57) ABSTRACT

A method for integrating a metal-insulator-metal (MIM) capacitor and a thin film resistor in an integrated circuit is provided that includes depositing a first metal layer outwardly of a semiconductor wafer substrate. A portion of the first metal layer forms a bottom plate for a MIM capacitor. A second metal layer is deposited outwardly of the first metal layer. A first portion of the second metal layer forms a top plate for the MIM capacitor and a second portion of the second metal layer forms contact pads for a thin film resistor.

4 Claims, 4 Drawing Sheets

METHOD FOR INTEGRATING MIM CAPACITOR AND THIN FILM RESISTOR IN MODULAR TWO LAYER METAL PROCESS AND CORRESPONDING DEVICE

TECHNICAL FIELD

This disclosure is generally directed to integrated circuit fabrication. More specifically, this disclosure is directed to a method for integrating a metal-insulator-metal (MIM) capacitor and a thin film resistor in a modular two layer metal process and a corresponding device.

BACKGROUND

Capacitors and thin film resistors are often incorporated in process technologies used for analog and mixed signal applications. Generally, in fabricating integrated circuits that include these components, the large-capacitance MIM capacitors are formed over the transistors at the metal level due to the area requirements of the capacitors.

A thin film resistor is a resistor formed from a relatively thin layer of resistive material. Numerous resistive materials, such as doped polysilicon, SiCCr and NiCr, have been used to form the resistive layer. Parameters important for a thin film resistor include the resistor value, tolerance of the resistor value, the temperature coefficient of resistance, and the ability of similarly formed resistors to have similar values, known as matching.

A conventional process sequence for forming both a MIM capacitor and a thin film resistor in a standard interconnect process flow requires three metal layers. Thus, if a conventional two layer metal process is used, either MIM capacitors or thin film resistors may be included but not both.

For example, for one currently implemented process, a metal stack is deposited on a semiconductor wafer substrate that has completed front-end processing through the first interconnect dielectric deposition and contact formation. Some examples of a typical metal stack are a stack of Ti (100 Å typical thickness), TiN (250 Å typical thickness), AlCu (10000 Å typical thickness), and TiN (500 Å typical thickness). The metal stack is then patterned and etched, followed by dielectric deposition and planarization.

A trench is then etched in the dielectric and filled with material that acts as a contact pad for the thin film resistor. One example of the trench fill material is AlCu (1500 Å typical thickness). Next, planarization of the trench fill is done. After planarization, material for the thin film resistor is deposited, patterned and etched. Some examples of thin film resistor material are SiCCr, NiCr, and TiW. Following this, dielectric is deposited and planarized. Contact to the thin film resistor is then provided through a thin film resistor via, which is formed by patterning, etching, and via filling.

A separate via formation to contact the metal stack is done next, with pattern, etch and via fill. A second metal deposition is done next to form a second metal stack. The second metal stack could be similar to the first metal stack in terms of layers used and their thicknesses. The second metal stack is used as a bottom plate for the MIM capacitor. MIM dielectric deposition is done next, followed by deposition of the MIM top plate, which may be AlCu with a thickness of about 1500 Å, for example. A window pattern and etch is then done to aid in alignment of the MIM pattern. Subsequently, the MIM pattern and etch are done to define the MIM capacitor. Connection to the MIM capacitor and thin film resistor are provided by doing the second metal stack deposition, pattern and etch.

Thus, this conventional process for integrating a MIM capacitor and a thin film resistor uses a total of five masking steps.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1A:
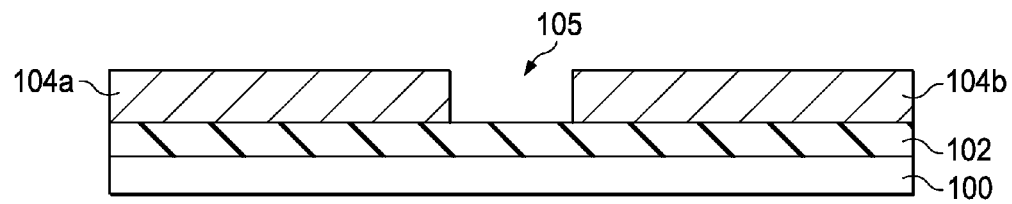
FIGS. 1A-I are a series of diagrams illustrating the integrated circuit fabrication steps for integrating a MIM capacitor and a thin film resistor in a modular two layer metal process in accordance with one embodiment of this disclosure.
Figure 1B:
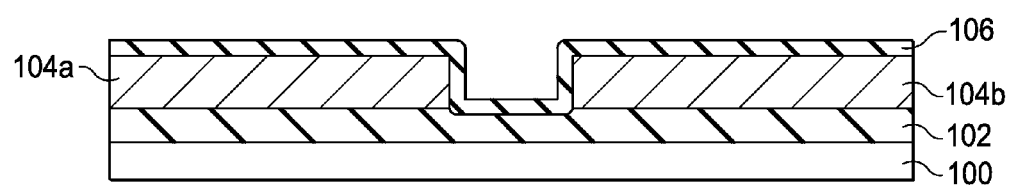
Figure 1C:
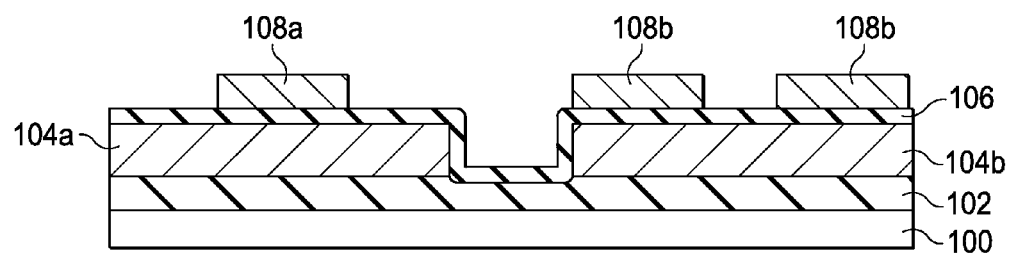
Figure 1D:
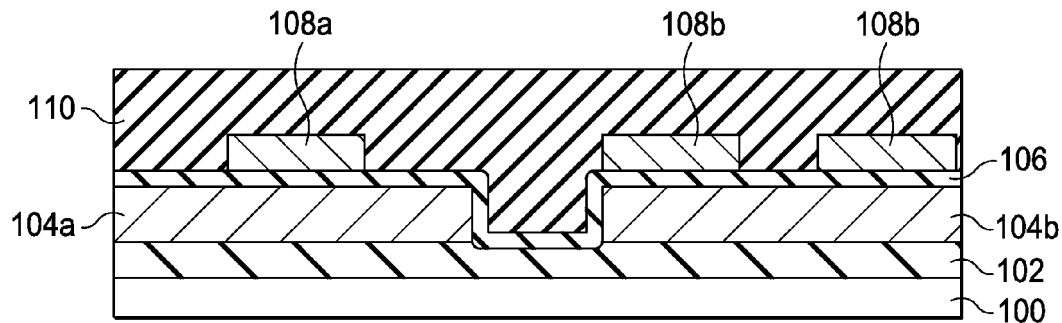
Figure 1E:
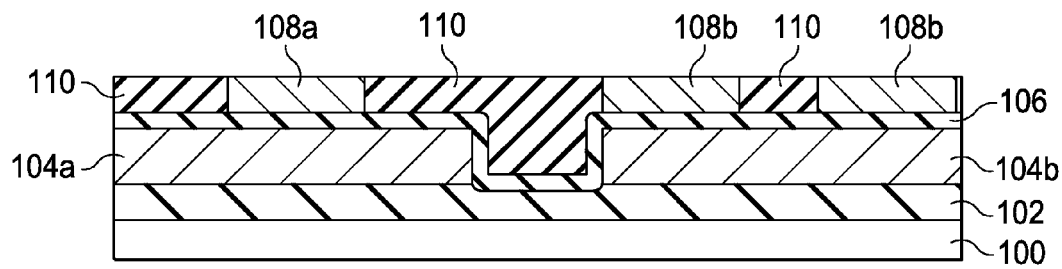
Figure 1F:
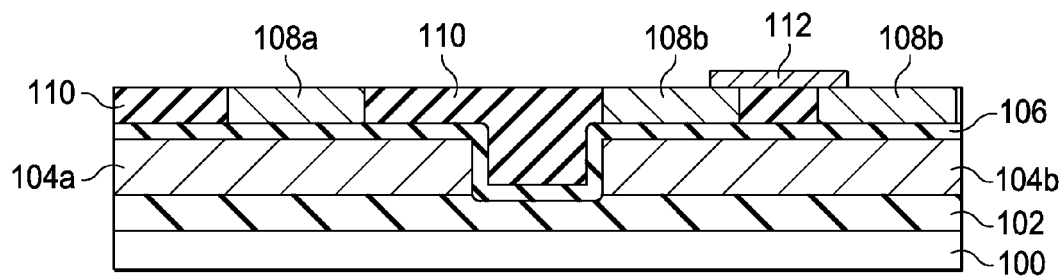
Figure 1G:
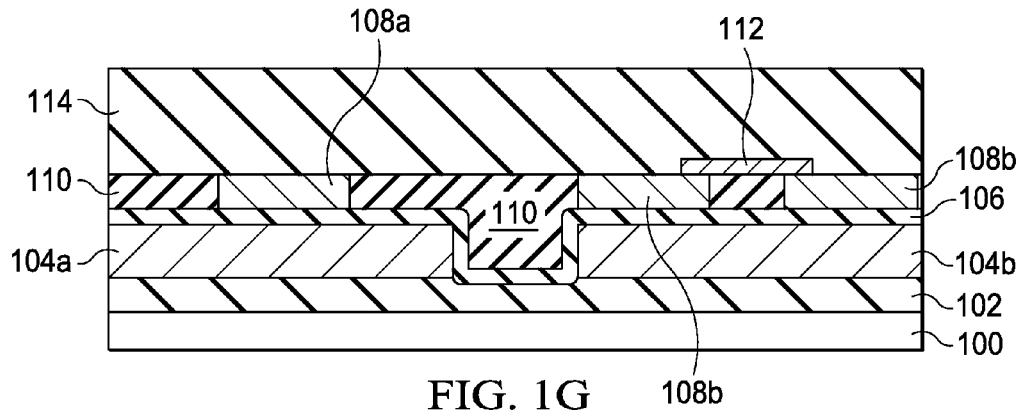
Figure 1H:
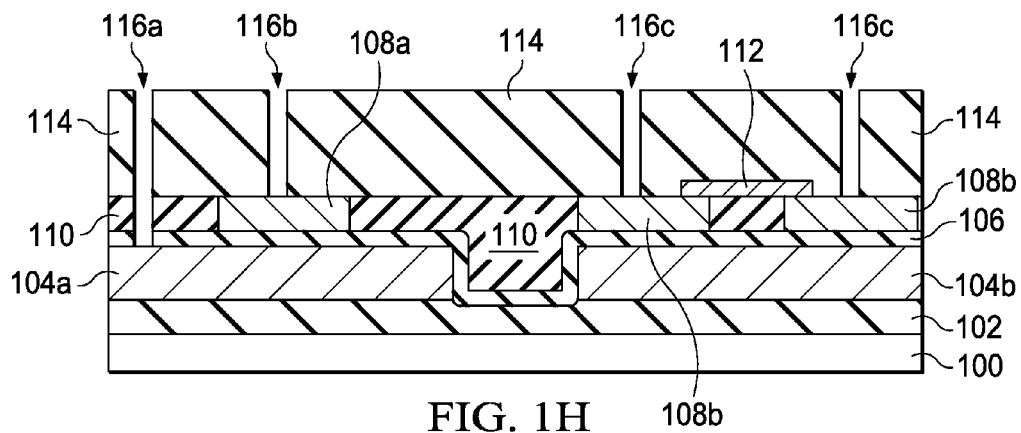
Figure 1I:
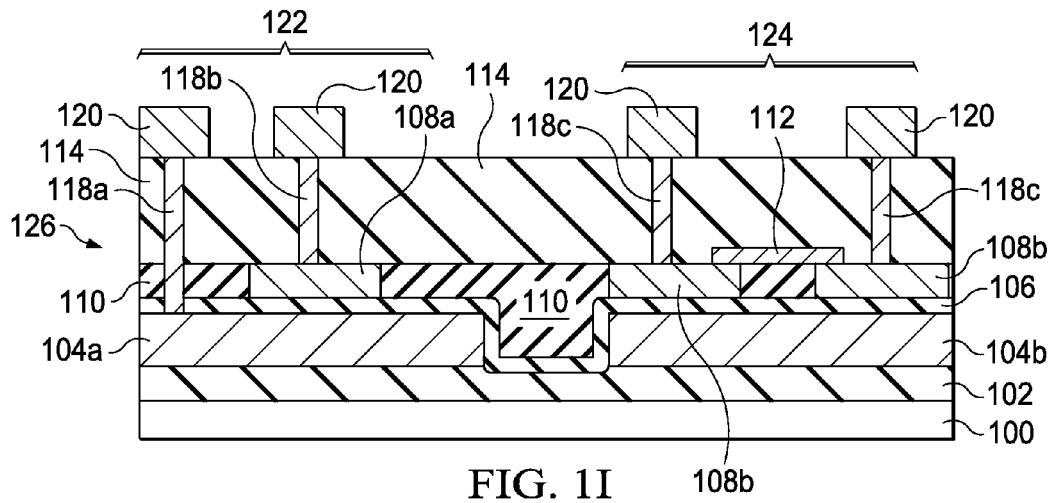
Figure 2:
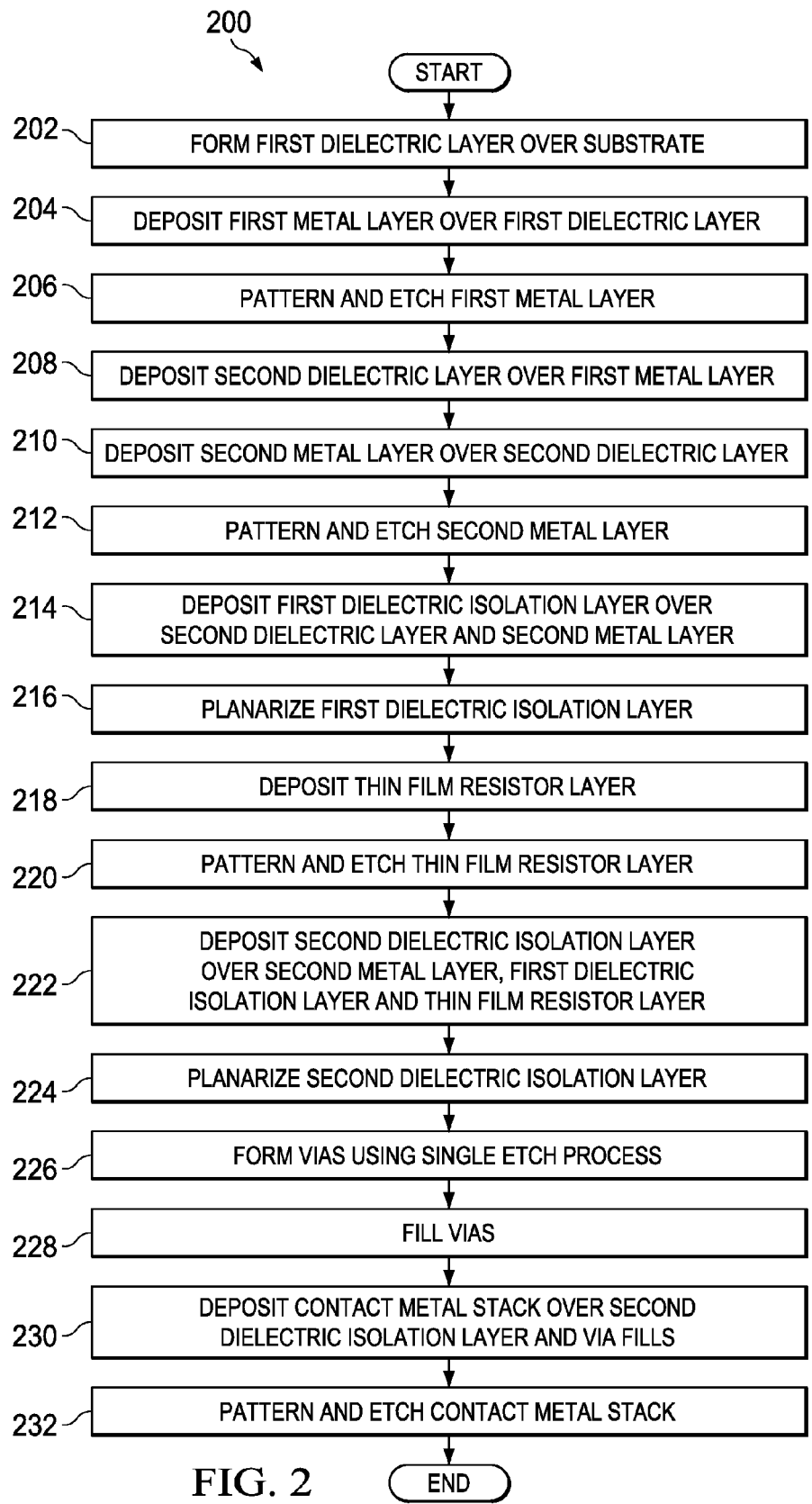
FIG. 2 is a flow diagram illustrating a method for integrating a MIM capacitor and a thin film resistor in a modular two layer metal process in accordance with one embodiment of this disclosure.

FIGS. 1-2, discussed below, and the various embodiments used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

FIGS. 1A-I are a series of diagrams illustrating the integrated circuit fabrication steps for integrating a metal-insulator-metal (MIM) capacitor and a thin film resistor in a modular two layer metal process in accordance with one embodiment of this disclosure. A semiconductor wafer substrate 100 is provided over which a first dielectric layer 102 may be deposited. The substrate may comprise a silicon wafer and may be unprocessed or include existing underlying circuitry (not illustrated). The first dielectric layer 102 may comprise any suitable dielectric material, such as silicon dioxide, silicon nitride, low-k dielectrics, polymers or the like, and may be formed using any suitable deposition technique.

As shown in FIG. 1A, a first metal layer 104 is deposited over the first dielectric layer 102. The first metal layer 104 may be formed using any suitable deposition technique. For a particular embodiment, the first metal layer 104 may comprise Ti (with a thickness of about 100 Å), TiN (with a thickness of about 250 Å), AlCu (with a thickness of about 10,000 Å), or TiN (with a thickness of about 500 Å). However, it will be understood that the first metal layer 104 may comprise any suitable conductive material of any suitable thickness.

The first metal layer 104 illustrated in FIG. 1A has been patterned and etched using any suitable photolithography and etch techniques. The first metal layer 104 is patterned with a design corresponding to the structure of the device being manufactured. For example, a separator opening 105 may be etched through the first metal layer 104 in order to separate each area in which a distinct component, such as a MIM capacitor or a thin film resistor, is to be formed. For the embodiment illustrated in FIGS. 1A-I, a first portion 104a of the first metal layer 104 forms a bottom plate for a MIM capacitor, and a second portion 104b of the first metal layer 104 corresponds to an area of the structure in which a thin film resistor will be formed.

As shown in FIG. 1B, a second dielectric layer 106 is deposited over the patterned first metal layer 104. The second dielectric layer 106 forms the insulator portion of the MIM capacitor and serves as a barrier to insulate the thin film resistor from the first metal layer 104b. The second dielectric layer 106 may comprise an oxide film, a nitride film, or any suitable dielectric material of any suitable thickness and may be formed using any suitable deposition technique.

As shown in FIG. 1C, a second metal layer 108 is deposited over the second dielectric layer 106. The second metal layer 108 may be formed using any suitable deposition technique. For a particular embodiment, the second metal layer 108 may comprise AlCu (with a thickness of about 1500 Å). However, it will be understood that the second metal layer 108 may comprise any suitable conductive material of any suitable thickness.

The second metal layer 108 illustrated in FIG. 1C has been patterned and etched using any suitable photolithography and etch techniques. The second metal layer 108 is patterned with a design corresponding to the structure of the device being manufactured. For example, for the embodiment illustrated in FIGS. 1A-I, a first portion 108a of the second metal layer 108 forms a top plate for the MIM capacitor, and a second portion 108b of the second metal layer 108 forms contact pads for the thin film resistor.

As shown in FIG. 1D, a first dielectric isolation layer 110 is deposited over the second dielectric layer 106 and the patterned second metal layer 108. The first dielectric isolation layer 110 serves as an intra-level isolator for the first metal layer 104. The first dielectric isolation layer 110 may comprise any suitable dielectric material and may be formed using any suitable deposition technique. As shown in FIG. 1E, the first dielectric isolation layer 110 is planarized to expose the second metal layer 108.

As shown in FIG. 1F, a thin film resistor layer 112 is deposited. The thin film resistor layer 112 illustrated in FIG. 1F has been patterned and etched using any suitable photolithography and etch techniques such that the etched thin film resistor layer 112 corresponding to a particular thin film resistor overlaps the contact pads 108b. Thus, the contact pads 108b will allow contact to be made to the thin film resistor layer 112 without requiring a via to be etched directly to the thin film resistor layer 112. For a particular embodiment, the thin film resistor layer 112 may comprise SiCCr, NiCr, or TiW (with a thickness of about 75 Å). However, it will be understood that the thin film resistor layer 112 may comprise any suitable resistive material of any suitable thickness.

As shown in FIG. 1G, a second dielectric isolation layer 114 is deposited over the second metal layer 108, the first dielectric isolation layer 110 and the thin film resistor layer 112, after which the second dielectric isolation layer 114 is planarized. The second dielectric isolation layer 114 serves as an inter-level isolator between the first metal layer 104 and a contact metal stack 120 (shown in FIG. 1I). The second dielectric isolation layer 114 may comprise any suitable dielectric material and may be formed using any suitable deposition technique.

As shown in FIG. 1H, vias 116 are formed through the dielectric. A bottom plate via 116a is formed by etching through the second dielectric isolation layer 114, the first dielectric isolation layer 110, and the second dielectric layer 106 to the bottom plate 104a. During the same etch process, a top plate via 116b and contact pad vias 116c are formed by etching through the second dielectric isolation layer 114 to the top plate 108a and the contact pads 108b, respectively.

Because the top plate 108a of the MIM capacitor and the contact pads 108b of the thin film resistor are at the same level in the back end interconnect, the top plate via 116b and the contact pad vias 116c are the same depth. In addition, the difference in depth between these vias 116b and 116c and the bottom plate via 116a is relatively small, and the additional material to be etched to reach the bottom plate 104a is also dielectric material. Therefore, a single etch may be used to form each of the vias 116a, 116b and 116c.

As shown in FIG. 1I, the vias 116 are filled with any suitable via fill 118 and a contact metal stack 120 is deposited over the second dielectric isolation layer 114 and the via fills 118. The contact metal stack 120 may be formed using any suitable deposition technique and may comprise any suitable conductive material of any suitable thickness. The contact metal stack 120 illustrated in FIG. 1I has been patterned and etched using any suitable photolithography and etch techniques. The contact metal stack 120 is patterned to form top level contacts to the MIM capacitor 122 and the thin film resistor 124.

Thus, as shown in FIG. 1I, an integrated circuit device 126 comprising both a MIM capacitor 122 and a thin film resistor 124 may be formed with only two additional masking steps over a standard back end interconnect flow, as compared to the five additional masking steps used in fabricating conventional devices that integrate a MIM capacitor and a thin film resistor. In addition, a MIM capacitor 122 and a thin film resistor 124 may be formed using a two layer metal process, as compared to the three layer metal process used in fabricating conventional devices that integrate a MIM capacitor and a thin film resistor. Also, this process integration sequence is modular in nature, i.e., the MIM capacitor 122 can be incorporated by itself into the standard two layer metal process flow, the thin film resistor 124 can be incorporated by itself into the standard two layer metal process flow, or both 122 and 124 may be incorporated into the standard flow without any detrimental impact.

Yet another advantage of the illustrated integrated circuit 126 results from the first metal layer 104 forming the bottom plate of the MIM capacitor 122. Because of this, as shown in FIG. 1J, multiple MIM capacitors 122 may be coupled in parallel by using the same continuous portion 104a of the first metal layer 104 as the bottom plate for each of the parallel-coupled MIM capacitors, thereby reducing area consumption in circuit layout design. Similarly, because the MIM capacitor top plate 108a and the thin film resistor contact pads 108b are formed from the second metal layer 108, the MIM capacitor 122 and the thin film resistor 124 may be coupled in parallel by simply not etching the second metal layer 108 between them (as shown by element 108d of FIG. 1K), allowing circuit layout design flexibility and area savings.

FIG. 2 is a flow diagram illustrating a method 200 for integrating a MIM capacitor 122 and a thin film resistor 124 in a modular two layer metal process in accordance with one embodiment of this disclosure.

Initially, the first dielectric layer 102 is formed over a substrate (step 202). The first metal layer 104 is deposited over the first dielectric layer 102 (step 204). The first metal layer 104 is patterned and etched to separate each area in which a distinct component, such as a MIM capacitor or a thin film resistor, is to be formed (step 206). Thus, for example, a first portion 104a of the first metal layer 104 may form the bottom plate for the MIM capacitor 122, and a second portion 104b of the first metal layer 104 may correspond to an area of the structure in which the thin film resistor 124 will be formed.

The second dielectric layer 106 is deposited over the patterned first metal layer 104 (step 208). The second metal layer 108 is deposited over the second dielectric layer 106 (step 210). The second metal layer 108 is patterned and etched based on the structure of the device being manufactured (step 212). For example, a first portion 108a of the second metal layer 108 may form the top plate for the MIM capacitor 122, and a second portion 108b of the second metal layer 108 may form contact pads for the thin film resistor 124.

The first dielectric isolation layer 110 is deposited over the second dielectric layer 106 and the patterned second metal layer 108 (step 214). The first dielectric isolation layer 110 is planarized to expose the second metal layer 108 (step 216). Next, the thin film resistor layer 112 is deposited (step 218). The thin film resistor layer 112 is patterned and etched such that the etched thin film resistor layer 112 overlaps the contact pads 108b (step 220). The second dielectric isolation layer 114 is deposited over the second metal layer 108, the first dielectric isolation layer 110 and the thin film resistor layer 112 (step 222), after which the second dielectric isolation layer 114 is planarized (step 224).

In a single etch process, vias 116 are formed through the dielectric (step 226). The bottom plate via 116a is formed by etching through the second dielectric isolation layer 114, the first dielectric isolation layer 110, and the second dielectric layer 106 to the bottom plate 104a. At the same time, the top plate via 116b and the contact pad vias 116c are formed by etching through the second dielectric isolation layer 114 to the top plate 108a and the contact pads 108b, respectively.

The vias 116 are filled (step 228) and the contact metal stack 120 is deposited over the second dielectric isolation layer 114 and the via fills 118 (step 230). The contact metal stack 120 is patterned and etched to form top level contacts to the MIM capacitor 122 and the thin film resistor 124 (step 232).

Thus, in this way, an integrated circuit device 126 comprising both a MIM capacitor 122 and a thin film resistor 124 may be formed with only two additional masking steps over a standard back end interconnect flow (i.e., steps 212 and 220). In addition, a MIM capacitor 122 and a thin film resistor 124 may be formed using a modular two layer metal process (with the two layers corresponding to the first metal layer 104 and the second metal layer 108).

It may be advantageous to set forth definitions of certain words and phrases that have been used within this patent document. The term "couple" and its derivatives refer to any direct or indirect communication between two or more components, whether or not those components are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The term "each" means every one of at least a subset of the identified items. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method for integrating a metal-insulator-metal (MIM) capacitor and a thin film resistor in an integrated circuit, the method comprising:
   providing a semiconductor wafer substrate;
   depositing a first dielectric layer outwardly of the semiconductor wafer substrate; the first dielectric layer having a top surface;
   depositing a first metal layer outwardly of the first dielectric layer, touching the top surface of the first dielectric layer;
   patterning the first metal layer with a design corresponding to the structure of the integrated circuit being manufactured, wherein portions of the first metal layer are separated by separator openings etched down to the top surface of the first dielectric layer;
   also wherein a portion of the first metal layer forms a bottom plate for the MIM capacitor;
   depositing a second dielectric layer outwardly of the first metal layer wherein the second dielectric layer forms an insulator for the MIM capacitor;
   depositing a second metal layer outwardly of the second dielectric layer, the second metal layer having a top surface, wherein a first portion of the second metal layer forms a top plate for the MIM capacitor and a first contact pad for the thin film resistor, and wherein a second portion of the second metal layer forms a second contact pad for the thin film resistor, the MIM capacitor and the thin film resistor coupled in parallel;
   depositing a third dielectric layer outwardly of the second metal layer, and planarizing the third dielectric layer to expose the top surfaces of the top plate of the MIM capacitor and the first and second contact pads for the thin film resistor;
   forming a thin film resistor layer of the thin film resistor outwardly of and in electrical contact with the first and second contact pads;
   etching the thin film resistor layer such that a continuous portion of the etched thin film resistor layer physically contacts surfaces of the first and second contact pads;
   depositing a fourth dielectric layer outwardly of the thin film resistor layer and the top plate of the MIM capacitor, and planarizing the fourth dielectric layer; and
   forming multiple filled conductive vias outwardly of the second metal layer, each contact pad electrically connected to at least one of the filled conductive vias;
   wherein, after formation of the filled conductive vias, the thin film resistor layer is located between the filled conductive vias.

2. The method of claim 1, further comprising:
   forming a bottom plate via for the MIM capacitor, a top plate via for the MIM capacitor, and contact pad vias for the thin film resistor using a single etch process.

3. The method of claim 1, wherein the portion of the first metal layer that forms the bottom plate for the MIM capacitor comprises a continuous portion of the first metal layer that also forms a second bottom plate for a second MIM capacitor such that the MIM capacitor and the second MIM capacitor are coupled in parallel.

4. The method of claim 1, wherein the first portion of the second metal layer and the second portion of the second metal layer are disposed at a same level outward of the first metal layer and are separated by a dielectric material.

* * * * *